(12) United States Patent
Hashizume et al.

(10) Patent No.: US 6,203,618 B1
(45) Date of Patent: Mar. 20, 2001

(54) EXHAUST SYSTEM AND VACUUM PROCESSING APPARATUS

(75) Inventors: Junichiro Hashizume; Shigenori Ueda, both of Nara; Ryuji Okamura, Soraku-gun, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/277,815

(22) Filed: Mar. 29, 1999

(30) Foreign Application Priority Data

Mar. 31, 1998 (JP) .................................................. 10-103766
Mar. 24, 1999 (JP) .................................................. 11-080054

(51) Int. Cl.⁷ .................................................. C23C 16/00
(52) U.S. Cl. ............................................................. 118/715
(58) Field of Search ........................... 118/715, 723 VE; 415/90, 143; 417/423

(56) References Cited

U.S. PATENT DOCUMENTS

| | | | | |
|---|---|---|---|---|
| 4,228,004 | * | 10/1980 | Foster .................................... | 210/739 |
| 4,361,418 | * | 11/1982 | Tscheppe ............................... | 118/715 |
| 4,733,174 | * | 3/1988 | Crosby .................................. | 324/751 |
| 4,875,810 | * | 10/1989 | Chiba et al. ......................... | 118/692 |
| 4,896,043 | * | 1/1990 | Arakawa et al. ................. | 250/484.4 |
| 5,114,683 | * | 5/1992 | Hirase .................................. | 422/173 |
| 5,458,689 | * | 10/1995 | Saito ..................................... | 118/724 |
| 5,676,205 | * | 10/1997 | Whte ..................................... | 118/715 |
| 5,788,747 | * | 8/1998 | Horiuchi et al. ............... | 118/723 VE |
| 5,958,510 | * | 9/1999 | Sivaramakrishnam ............... | 118/719 |

FOREIGN PATENT DOCUMENTS

50165 * 9/1982 (JP) .

OTHER PUBLICATIONS

O'Hanlon, John F. A User's Guide to Vacuum Technology, 2nd Ed. pp. 349–379.*

* cited by examiner

*Primary Examiner*—Jeffrie R. Lund
*Assistant Examiner*—Sylivia R MacArthur
(74) *Attorney, Agent, or Firm*—Fitzpatrick, Cella, Harper & Scinto

(57) ABSTRACT

In a vacuum processing apparatus comprising a reactor and a vacuum pump connected to the reactor to draw up a gas held in the reactor, the vacuum pump comprising a diffusion pump and an auxiliary pump, the diffusion pump and the auxiliary pump are connected through an exhaust line and a cooling unit is provided in the exhaust line, whereby the gas is cooled by the cooling unit to liquefy or condense an oil smoke comprised of a diffusion pump oil contained in the gas, to cause the resultant oil to deposit in the exhaust line.

The diffusion pump oil can be prevented from flowing into the auxiliary pump even when material gases fed in at a high rate are exhausted.

24 Claims, 12 Drawing Sheets

EXHAUST SYSTEM AND VACUUM PROCESSING APPARATUS

BACKGROUND OF THE INVENTION

1. Field of the Invention

This invention relates to an exhaust system, an exhaust process, and a vacuum processing apparatus and a vacuum processing method which have the exhaust system. More particularly, it relates to an exhaust system, an exhaust process, and a vacuum processing apparatus and a vacuum processing method which have the exhaust system. The exhaust system is suitable for use in a vacuum processing apparatus including a deposited-film-forming apparatus that can form crystalline or non-single crystal functional deposited films useful in producing semiconductor devices, such as electrophotographic photosensitive member devices, image-inputting line sensors, image pick-up devices and photovoltaic devices, a sputtering apparatus that can preferably form insulating films and metallic wiring for semiconductor devices and optical devices, and an etching apparatus for semiconductor devices.

2. Related Background Art

Various plasma processing apparatuses are used for a variety of purposes. For example, oxide films or nitride films are formed by plasma CVD using a plasma CVD system, and semiconductor films as typified by amorphous silicon films are also formed. Also, metal films used as metallic wiring films are formed by sputtering using a sputtering apparatus, or processing targets are etched using an etching apparatus which enables fine processing. Development of such techniques is in progress. In particular, plasma processing making use of high-frequency power or microwave power has a high stability in discharging and is used because of its various advantages, e.g., it can be used in forming not only semiconductor films but also insulating materials such as oxide films and nitride films.

Now, in vacuum processing, in recent years there has been a strong demand for an improvement in film quality of films formed and process capability therefor, and various measures are being studied. In particular, from the viewpoint of improving film quality, increasing flim quality uniformity and controlling film thickness, making the degree of vacuum higher in the discharge space has been studied. For example, deposited-film-forming apparatuses are known to attain a high degree of vacuum by using a diffusion pump in combination with a rotary pump or mechanical booster pump, the former being a pump for evacuating the inside of a processing space and the latter being an auxiliary pump for assisting the evacuation made by the diffusion pump. The rotary pump or mechanical booster pump is used for roughing. In such an instance, the degree of vacuum achieved in the discharge space can be from about several hundred Pa to about 20 Pa. At present, a high degree of vacuum from about 10 mPa to 15 Pa can also be achieved by optimizing the form of evacuation. In such deposited-film-forming apparatuses, deposited films with less contamination and improved properties can be obtained by making the degree of vacuum in the discharge space higher.

In order to decrease production cost, it is important to improve the rate of deposition of functional films (i.e., rate of vacuum processing). Making the rate of deposition (rate of vacuum processing) higher brings about a higher throughput of the deposited-film-forming apparatus (vacuum processing apparatus). As a result, the cost necessary for plant investment can be reduced, and the processing cost for individual products can be reduced. Accordingly, in order to make the rate of processing higher while making it possible to improve film quality, increase film quality uniformity and control film thickness with ease, it is necessary to evacuate the inside of a processing chamber of the vacuum processing apparatus at a high rate and to a high vacuum by means of a vacuum pump with a large exhaust capacity, while feeding material gases at high flow rates to the vacuum processing apparatus.

Meanwhile, when material gases are exhausted at a high rate by means of a vacuum pump having a large exhaust capacity, it is preferable to use the diffusion pump. The diffusion pump can readily attain a large exhaust capacity, and the pump itself is inexpensive. When the diffusion pump is used in combination with the mechanical booster pump or rotary pump, the degree of vacuum attained can be 10 mPa to 15 Pa as stated above, and hence the above intended performance can be achieved sufficiently.

However, when such material gases fed at high flow rates are exhausted by the diffusion pump, diffusion pump oil vaporized from the diffusion pump flows to the side of the auxiliary pump mechanical booster pump or rotary pump together with the material gases to be exhausted. This results in an abrupt decrease in the quantity of the diffusion pump oil in the diffusion pump. The diffusion pump oil is expensive. The consumption of diffusion pump oil in a large quantity causes high production cost. Also, in order to supplement the diffusion pump oil, it is necessary to provide the steps of cooling the diffusion pump, thereafter restoring the internal vacuum state to the atmospheric pressure and then supplementing the diffusion pump oil. Frequent repetition of such steps results in a low operating efficiency of the system. Also, it is necessary to provide more maintenance to the diffusion pump. In addition, the oil flowed out of the diffusion pump to the auxiliary pump side stands in the auxiliary pump rotary pump. Such oil in the rotary pump may increase with long-term continuous use eventually cause trouble. Even if it does not lead to trouble, it has ill effects such as of lowering of exhaustion rate and conspicuous suspension of oils when oils different in properties are present. Moreover, since the diffusion pump oil which is not the oil for the rotary pump enters the rotary pump, it may cause wear of the rotary pump at its sliding faces and other problems which shorten the rotary pump lifetime. Of course, such problems are applicable similarly to a vacuum processing apparatus such as a deposited-film-forming apparatus, a sputtering apparatus and an etching apparatus.

SUMMARY OF THE INVENTION

An object of the present invention is to provide an exhaust system, an exhaust process, a vacuum processing apparatus and a vacuum processing method which can solve the above problem.

Another object of the present invention is to provide an exhaust system, an exhaust process, a vacuum processing apparatus and a vacuum processing method which, even when material gases fed at high flow rates are exhausted, do not results in diffusion pump oil flowing to the auxiliary pump side, thereby abruptly decreasing the amount of diffusion pump oil and causing such oil to stand in the auxiliary pump, which are durable to repeated use, which can maintain evacuation performance over a long period of time and which can achieve maintenance cost reduction.

Still another object of the present invention is to provide an exhaust system, an exhaust process, a vacuum processing apparatus and a vacuum processing method which enable easy and inexpensive control of vacuum processing, e.g., to improve film quality, to increase film quality uniformity and to control film thickness.

A further object of the present invention is to provide an exhaust system, an exhaust process, a vacuum processing apparatus and a vacuum processing method which make it easy to keep any contamination of processing targets to a minimum in the course of manufacturing process.

A still further object of the present invention is to provide an exhaust system, an exhaust process, a vacuum processing apparatus and a vacuum processing method which enable short-time production and cost reduction and promise good reproducibility of vacuum processing.

To achieve the above objects, the present invention provides an exhaust system comprising:

a first exhaust means;

a second exhaust means for exhausting an exhaust gas of the first exhaust means;

an exhaust line connecting the first exhaust means and the second exhaust means; and a cooling means for cooling the exhaust line, provided along the exhaust line.

The present invention also provides an exhaust process comprising the steps of:

exhausting an exhaust gas of a first exhaust means through a second exhaust means which connects the first exhaust means through an exhaust line;

liquefying in the exhaust line by a cooling means the exhaust gas flowing from the first exhaust means through the exhaust line; and exhausting by the second exhaust means the exhaust gas having passed through the step of liquefying the exhaust gas.

The present invention still also provides a vacuum processing apparatus comprising a reactor and a vacuum pump connected to the reactor to draw up a gas held in the reactor, the vacuum pump comprising a diffusion pump and an auxiliary pump, the apparatus further comprising:

an exhaust line provided between the diffusion pump and the auxiliary pump; and a cooling unit provided in the exhaust line, for cooling the gas to liquefy or condense an oil smoke comprised of a diffusion pump oil contained in the gas, to cause the resultant oil to deposit in the exhaust line.

The present invention further provides a vacuum processing method for forming a deposited film by a system comprising a reactor and a vacuum pump connected to the reactor to draw up a gas held in the reactor; the vacuum pump comprising at least a diffusion pump and an auxiliary pump; wherein the diffusion pump and the auxiliary pump are connected through an exhaust line and a cooling unit is provided in the exhaust line, where the gas is cooled by the cooling unit to liquefy or condense an oil smoke comprised of a diffusion pump oil contained in the gas, to cause the resultant oil to deposit in the exhaust line.

DESCRIPTION OF THE PREFERRED EMBODIMENTS

The present invention will be described below by giving an example of a deposited-film-forming apparatus. The vacuum processing apparatus of the present invention is not limited to the deposited-film-forming apparatus and may also be applied to other vacuum processing apparatuses such as a sputtering apparatus and an etching apparatus.

As stated previously, in the deposited-film-forming apparatus required to improve film quality, to increase film quality uniformity, to control film thickness with ease and to make the rate of processing higher, it is necessary to feed material gases into the processing space at a high flow rate and to keep the discharge space in the desired high-vacuum state. Accordingly, a vacuum pump with a large exhaust capacity is used so that the material gases fed can be exhausted from the discharge space at a high rate. In such an instance, the flow of exhaust gases at a high rate may draw out even the vapor of diffusion pump oil, thereby causing a problematic decrease in oil quantity in the diffusion pump in a short period of time. The diffusion pump oil is very expensive, and its expenditures in such a short time may cause a problematically high maintenance cost for the apparatus. Also, oil smoke occurring from the diffusion pump or vaporized diffusion pump oil melts into the pump oil of the auxiliary pump (usually the rotary pump) to change the properties of rotary pump oil and also to cause an increase in oil quantity, bringing about various difficulties such that the oil overflows the rotary pump and a mechanical load is applied to its motor. In the present invention, in order to solve such problems, the diffusion pump and the auxiliary pump are connected through an exhaust line and a cooling unit is provided in the exhaust line, where the diffusion pump oil contained in the exhaust gases in the form of oil smoke or vapor is liquefied or condensed in the exhaust line so that flowing of the diffusion pump oil can be prevented, or lessened as much as possible, into the auxiliary pump to substantially decrease or prevent diffusion pump oil expenditure.

The present invention also makes it possible to recover and reuse the diffusion pump oil formed by liquefying the oil smoke in the exhaust line (pipe), without lowering the operating efficiency of the vacuum pump. Hence, not only the diffusion pump oil can be prevented from being wasted, but also the operating efficiency of the apparatus can be maintained at a very high level. In addition, the present invention makes it possible to prevent or lessen the amount of diffusion pump oil that enters, other pumps such as the rotary pump which forms the back pressure of the diffusion pump, so that the maintenance performance and operating efficiency of the whole apparatus can be improved and also its maintenance and drive cost reduced.

Embodiments of the present invention will be described below in detail with reference to the accompanying drawings.

First Embodiment

Figure 1:
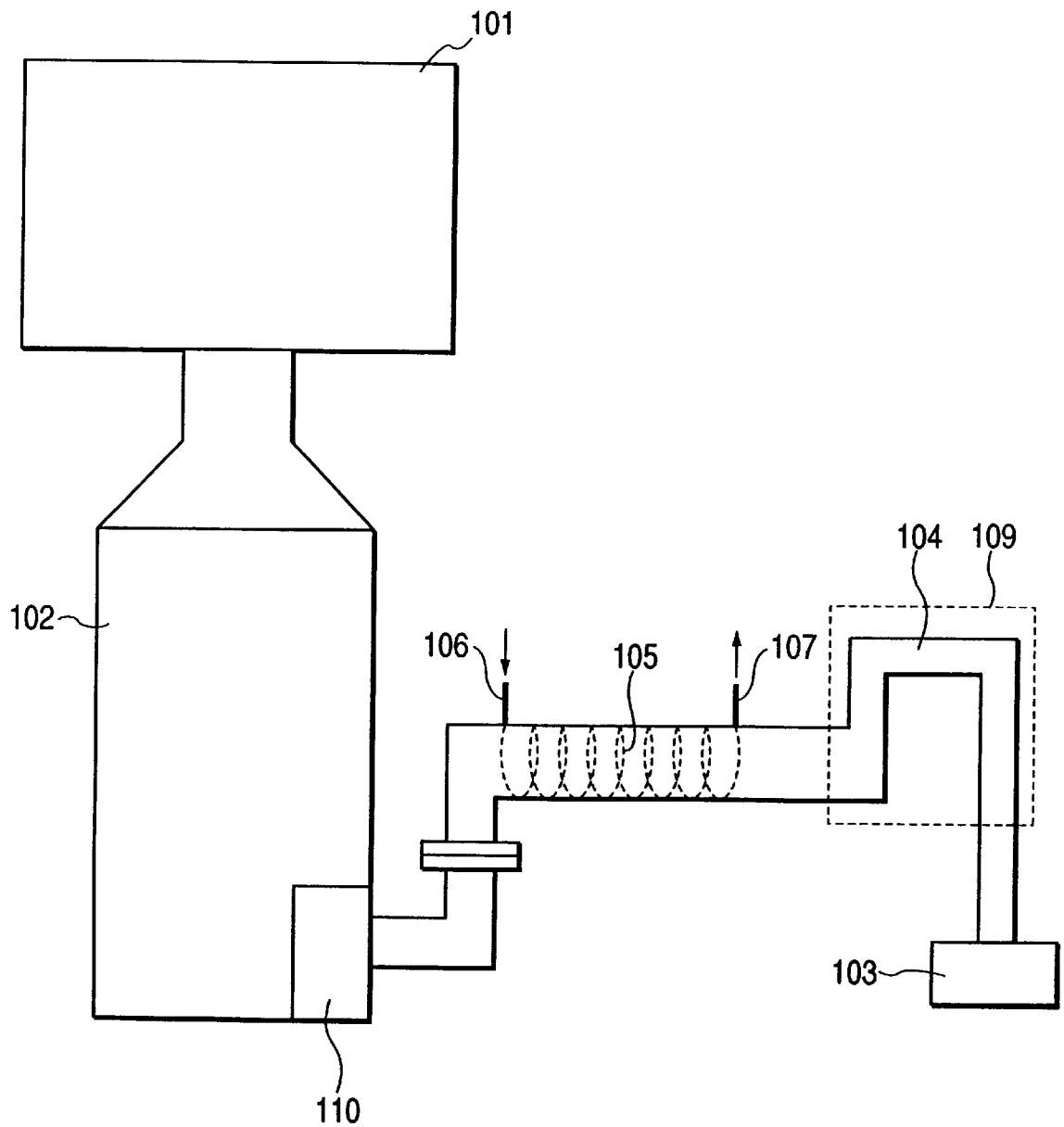
FIG. 1 is a diagrammatic side view of a deposited-film-forming apparatus as the vacuum processing apparatus of the present invention.

FIG. 1 is a diagrammatic view showing the construction of a deposited-film-forming apparatus as a vacuum processing apparatus according to a first embodiment of the present invention. In FIG. 1, reference numeral 101 denotes a film-forming furnace (a container) having a space to be evacuated which embraces a vacuum processing space; 102, a diffusion pump as a first exhaust means; 103, an auxiliary pump (usually a rotary pump or a combination of the rotary pump with a mechanical booster pump) as a second exhaust means for exhausting an exhaust gas of the first exhaust means; 104, an exhaust line connecting the diffusion pump 102 and the auxiliary pump 103, as a pipe connecting the first exhaust means and the second exhaust means; 105, a cooling pipe as a cooling means for cooling an exhaust path of the pipe, provided along the exhaust path; 106, a refrigerant inlet through which a refrigerant is flowed into the cooling pipe; and 107, a refrigerant outlet from which the refrigerant is discharged.

The first exhaust means, the second exhaust means, the pipe connecting the two and the cooling means basically constitute the exhaust system of the present invention.

The diffusion pump 102 has a diffusion pump oil recovery means 110. This diffusion pump oil recovery means 110 is an additional cooling means different from the cooling pipe 105 provided in the exhaust line 104, and is, e.g., a means attached inside the diffusion pump 102. The diffusion pump oil recovery means 110 can liquefy the greater part of the diffusion pump oil evaporated upon operation of the diffusion pump 102 and collect and return it to the diffusion pump 102.

The exhaust line 104 is connected with the diffusion pump 102 so as to draw out the gases held in the film-forming furnace 101 through the diffusion pump oil recovery means 110.

Either of the refrigerant inlet 106 and the refrigerant outlet 107 may be provided on the side close to the diffusion pump 102. A form in which the refrigerant inlet 106 is provided on the side closer to the diffusion pump 102 is preferred because of a higher cooling effect.

In the deposited-film-forming apparatus as a vacuum processing apparatus according to the first embodiment of the present invention, the exhaust line 104 is horizontally provided at its cooling pipe portion. The cooling means, cooling pipe 105 is provided inside the exhaust line 104 in a spiral form, and the refrigerant flows through the interior of the cooling pipe 105. Exhaust gases hold or contain the diffusion pump oil standing vaporized without being completely recovered by the diffusion pump oil recovery means 110, and the vaporized diffusion pump oil (oil smoke) is abruptly cooled to liquefy it when it passes through the exhaust line 104. As in the present invention, the exhaust line 104 is provided to extend from the diffusion pump 102 to the auxiliary pump 103 and also the cooling pipe 105 is provided inside the the exhaust line 104, whereby the oil smoke generated from the diffusion pump 102 can come into contact with the broad inner wall surface of the cooling pipe 105 for a long time and evenly in the exhaust line 104, so that the oil smoke can be liquefied effectively. Thus, in the present embodiment, providing the cooling pipe 105 in the exhaust line 104 enables the oil smoke to be prevented from being drawn up from the diffusion pump 102 to the auxiliary pump 103.

Figure 2:
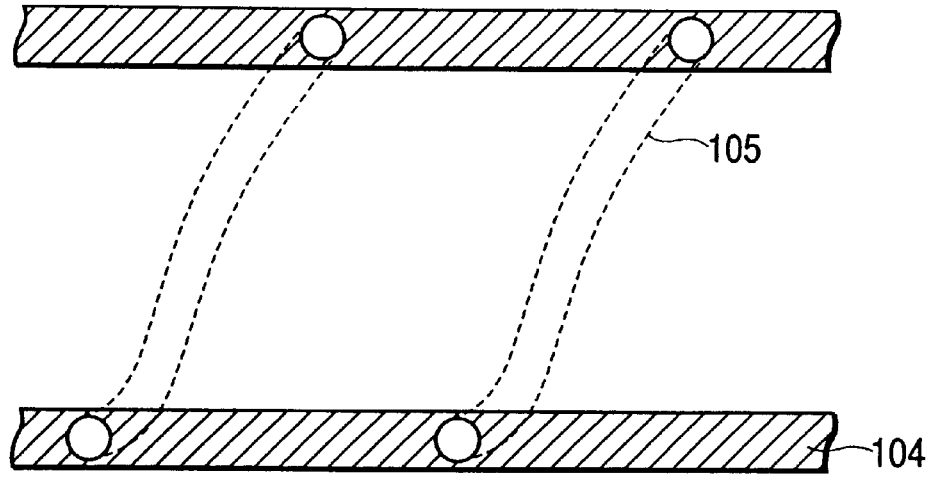
FIG. 2 illustrates a pipe and a cooling means which are used in the present invention.
Figure 3:
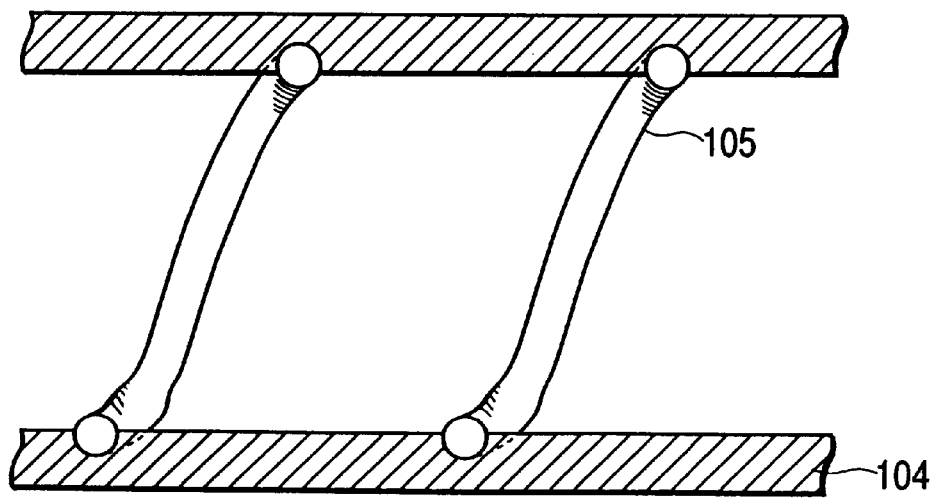
FIG. 3 illustrates a pipe and a cooling means which are used in the present invention.

FIGS. 2 and 3 are partial diagrammatic cross-sectional views of the exhaust line 104 according to the present embodiment, which are shown along the lengthwise direction of the exhaust line 104. The cooling pipe 105 may be provided in the wall of the exhaust line 104 as shown in FIG. 2. It may also be provided as shown in FIG. 3, in such a manner that at least part of the cooling pipe 105 stands bare to the gas passage of the exhaust line 104. In the latter case, the exhaust gases flowing through the gas passage can come into direct contact with the cooling pipe 105 in a broad area.

In the present embodiment, the exhaust line 104 is also provided with a rising part 109 in the vicinity of the auxiliary pump 103. This rising part 109 serves as a barrier, and the diffusion pump oil formed by liquefying the oil smoke by the aid of the cooling pipe 105 is further prevented from flowing into the auxiliary pump 103. The cooling pipe 105 may be provided in the exhaust line 104 in such a manner as to extend from the side closer to the diffusion pump 102 and reaches the rising part 109 or may be provided in such a manner as to not reach the rising part 109.

The exhaust gases from which the diffusion pump oil has been removed by the aid of the cooling pipe 105 are exhausted outside the system of the vacuum processing apparatus by means of the auxiliary pump 103. However, when exhausted, the exhaust gases by no means contaminate the oil held in the auxiliary pump 103. The diffusion pump oil formed by liquefying the oil smoke by the aid of the cooling pipe 105 stands in the interior of the exhaust line 104, and hence may appropriately discharged so as to be recovered.

The diffusion pump oil recovered or collected by the method of the present invention does not stand mixed with other oils, and can be free from quality deterioration. Hence, it can be reused by returning it to the diffusion pump.

Second Embodiment

Figure 4:
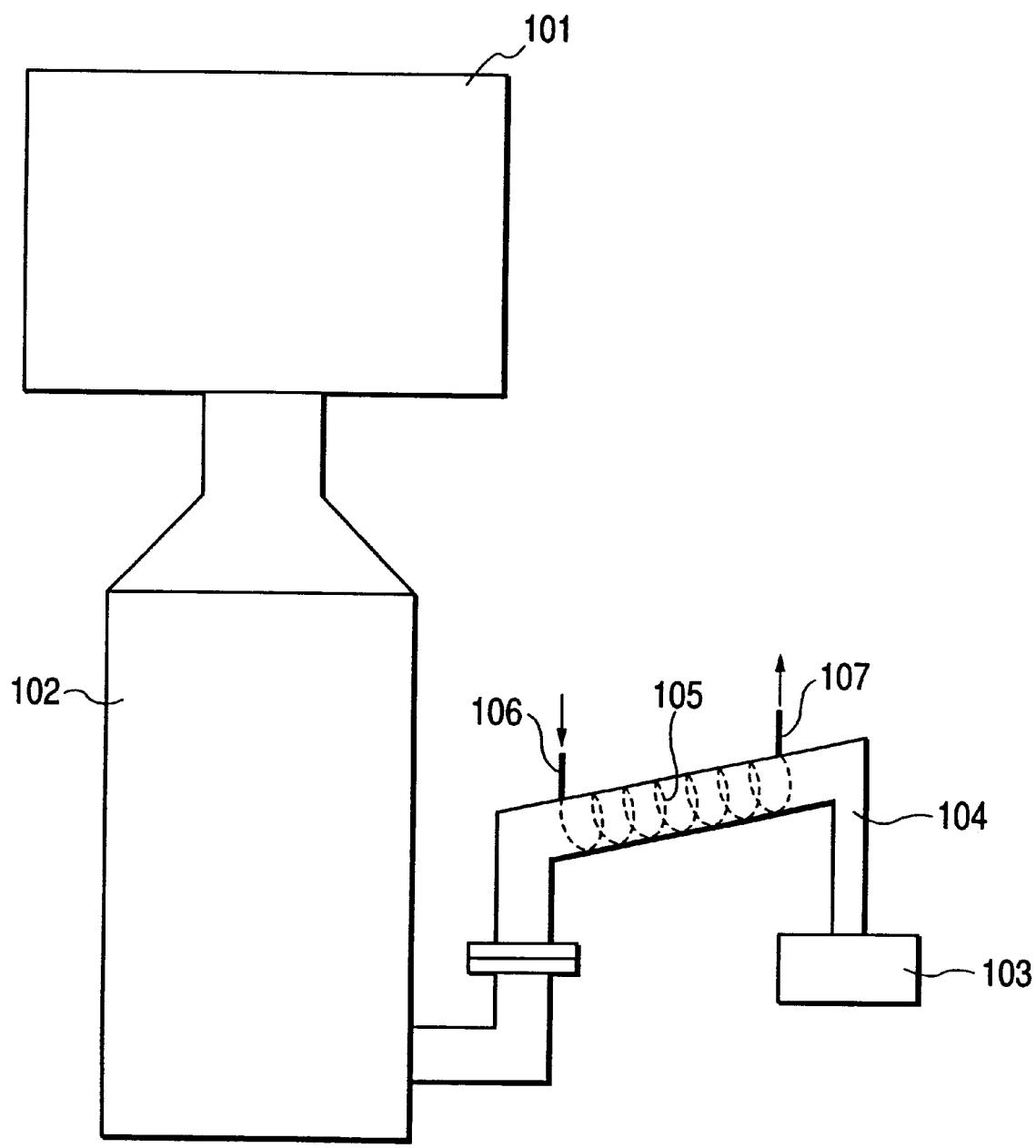
FIG. 4 is a diagrammatic side view of another deposited-film-forming apparatus as the vacuum processing apparatus of the present invention.

A deposited-film-forming apparatus as a vacuum processing apparatus according to a second embodiment of the present invention is the same as the first embodiment except that, as shown in FIG. 4, the exhaust line 104 is, at its cooling pipe portion, set low on the side of the diffusion pump 102 and high on the side of the auxiliary pump 103. Since the exhaust line 104 is set in this way, it follows that the diffusion pump oil formed by liquefying the oil smoke by the aid of the cooling pipe 105 returns naturally to the interior of the diffusion pump 102 by its own weight. Accordingly, the diffusion pump oil can readily be reused while saving time and labor for detaching the exhaust line 104 to remove the diffusion pump oil standing in the interior.

Third Embodiment

Figure 5:
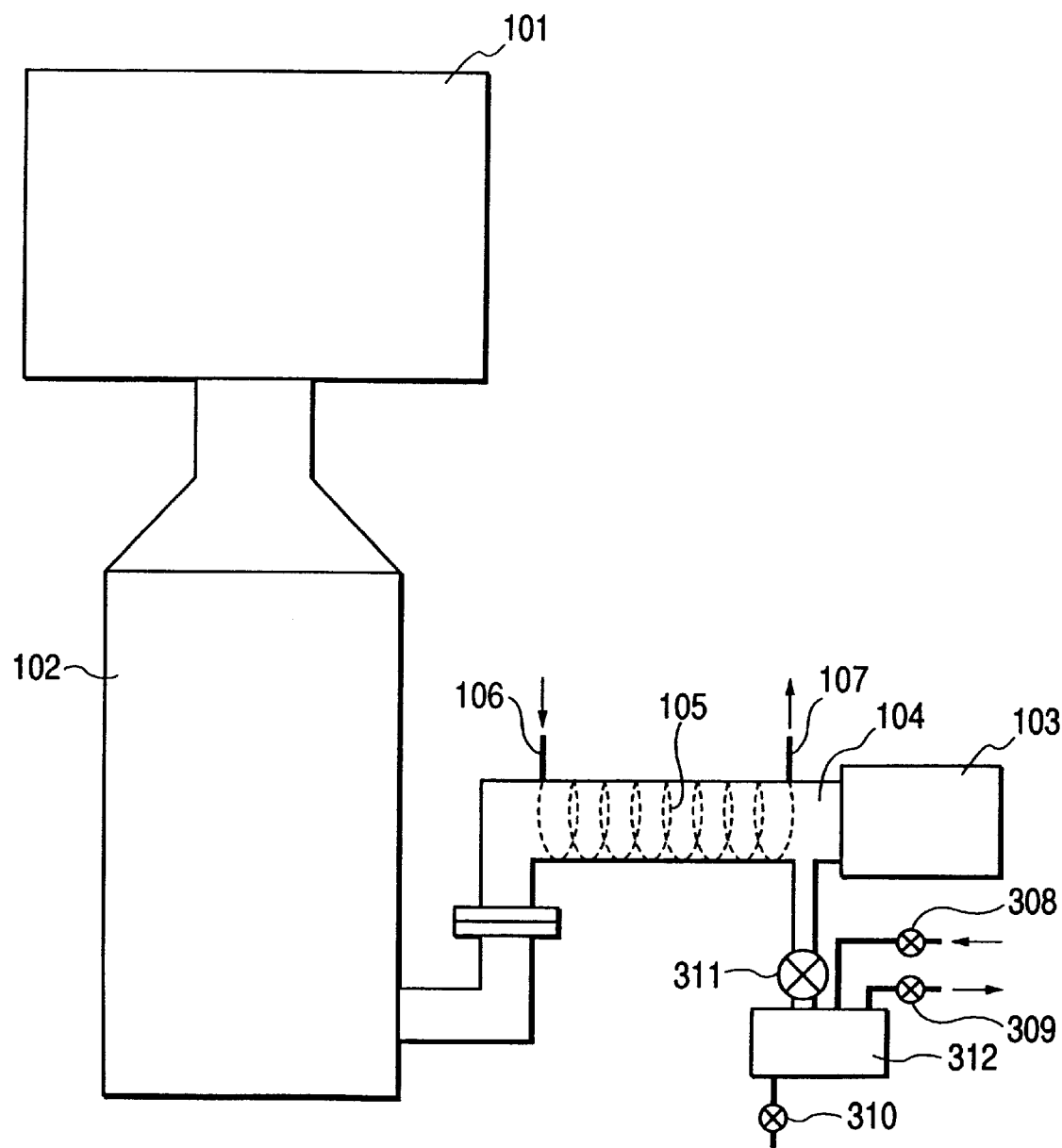
FIG. 5 is a diagrammatic side view of still another deposited-film-forming apparatus as the vacuum processing apparatus of the present invention.

A deposited-film-forming apparatus as a vacuum processing apparatus according to a third embodiment of the present invention is characterized by, as shown in FIG. 5, an exhaust line 104 attached at its cooling pipe portion to an oil reservoir 312 provided in the vicinity of the auxiliary pump 103. Other features are the same as those in the first embodiment.

Since the oil reservoir 312 is provided, the time and labor for detaching the exhaust line 104 can be saved when the diffusion pump oil formed by liquefying the oil smoke is removed. The oil reservoir 312 is provided with a leak valve 308, an evacuation valve 309, an oil discharge valve 310 and an on-off valve 311. Usually, the on-off valve 311 is open and the leak valve 308, evacuation valve 309 and oil discharge valve 310 are closed so that the diffusion pump oil in the exhaust line 104 can gather in the oil reservoir 312.

When the diffusion pump oil having gathered in the oil reservoir 312 is removed, the on-off valve 311 is closed and the internal pressure of the oil reservoir 312 is restored to atmospheric pressure by operating the leak valve 308. Thereafter, the oil discharge valve 310 is opened to remove the diffusion pump oil. After it has been removed, the oil discharge valve 310 and the leak valve 308 are closed, and the evacuation valve 309 is opened to evacuate the inside of the oil reservoir 312. After it has been evacuated, the evacuation valve 309 is closed, and the on-off valve 311 is opened so that the oil can be received. Such operation enables the diffusion pump oil to be removed without restoring the internal pressure of the diffusion pump 102 and auxiliary pump 103 to atmospheric pressure, and hence the operating efficiency can be maintained. Thus, this is a preferred embodiment.

Fourth Embodiment

Figure 6:
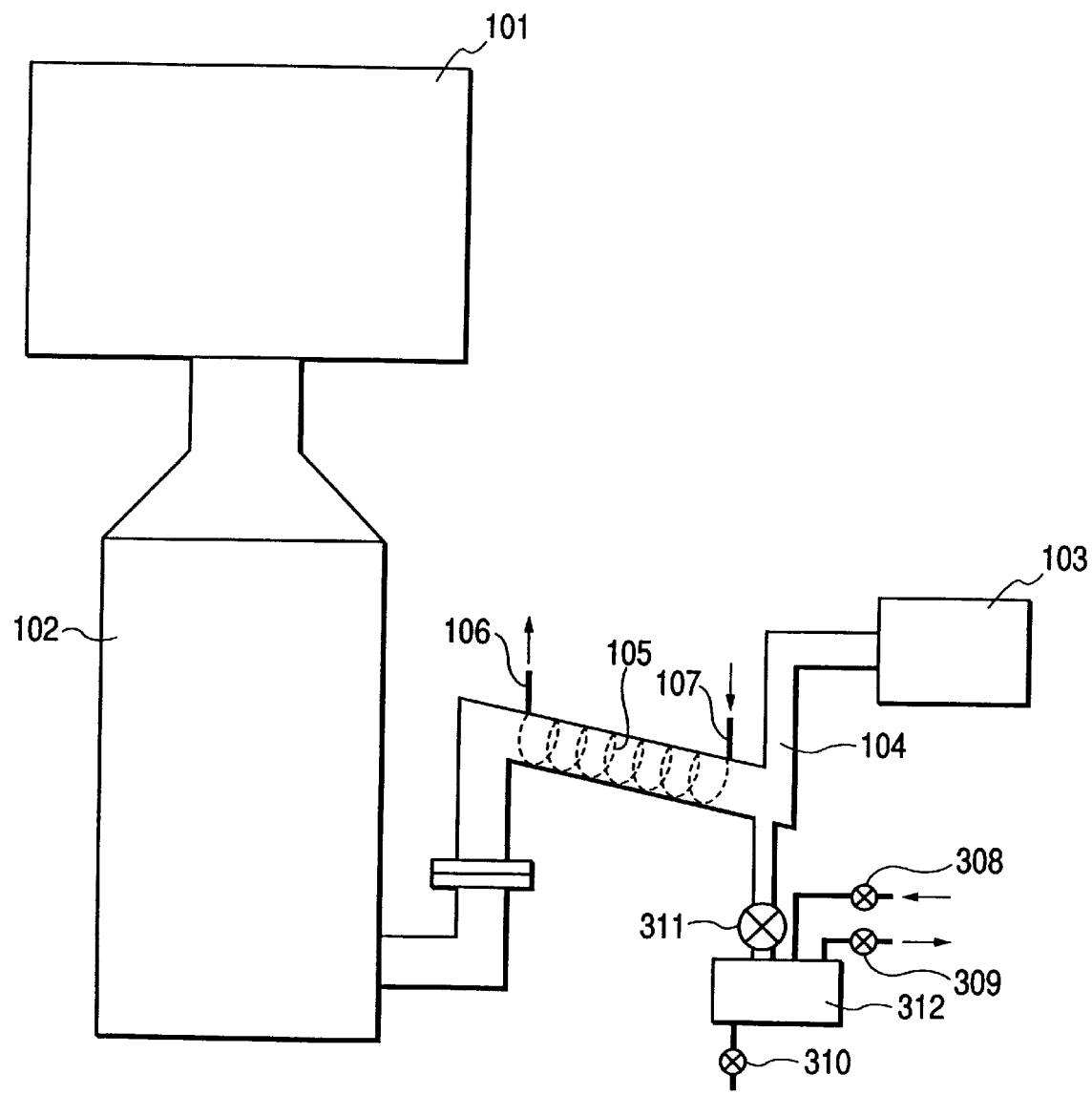
FIG. 6 is a diagrammatic side view of still another deposited-film-forming apparatus as the vacuum processing apparatus of the present invention.

A deposited-film-forming apparatus as a vacuum processing apparatus according to a fourth embodiment of the present invention is so embodied that, as shown in FIG. 6, the exhaust line 104 is, at its cooling pipe portion, set high on the side of the diffusion pump 102 and low on the side of the auxiliary pump 103 and also the exhaust line 104 connecting the oil reservoir 312 and the auxiliary pump 103 is raised on the side of the auxiliary pump 103 to form a rising part. Other features are the same as those in the third embodiment. Namely, the oil reservoir 312 is provided on the side of the auxiliary pump 103, and the oil reservoir 312 is provided with a leak valve 308, an evacuation valve 309, an oil discharge valve 310 and an on-off valve 311. According to the present embodiment, the diffusion pump oil formed by liquefying the oil smoke can more effectively be collected in the oil reservoir 312 while utilizing its own weight.

The exhaust line 104 in the present embodiment may otherwise be, at its cooling pipe portion, set low on the side of the diffusion pump 102 and high on the side of the auxiliary pump 103. In such an instance, the diffusion pump oil formed by liquefying the oil smoke can readily be collected in the diffusion pump 102 by its own weight; thus, the time until the oil reservoir 312 fills with the diffusion pump oil can be extened to a degree.

Fifth Embodiment

Figure 7:
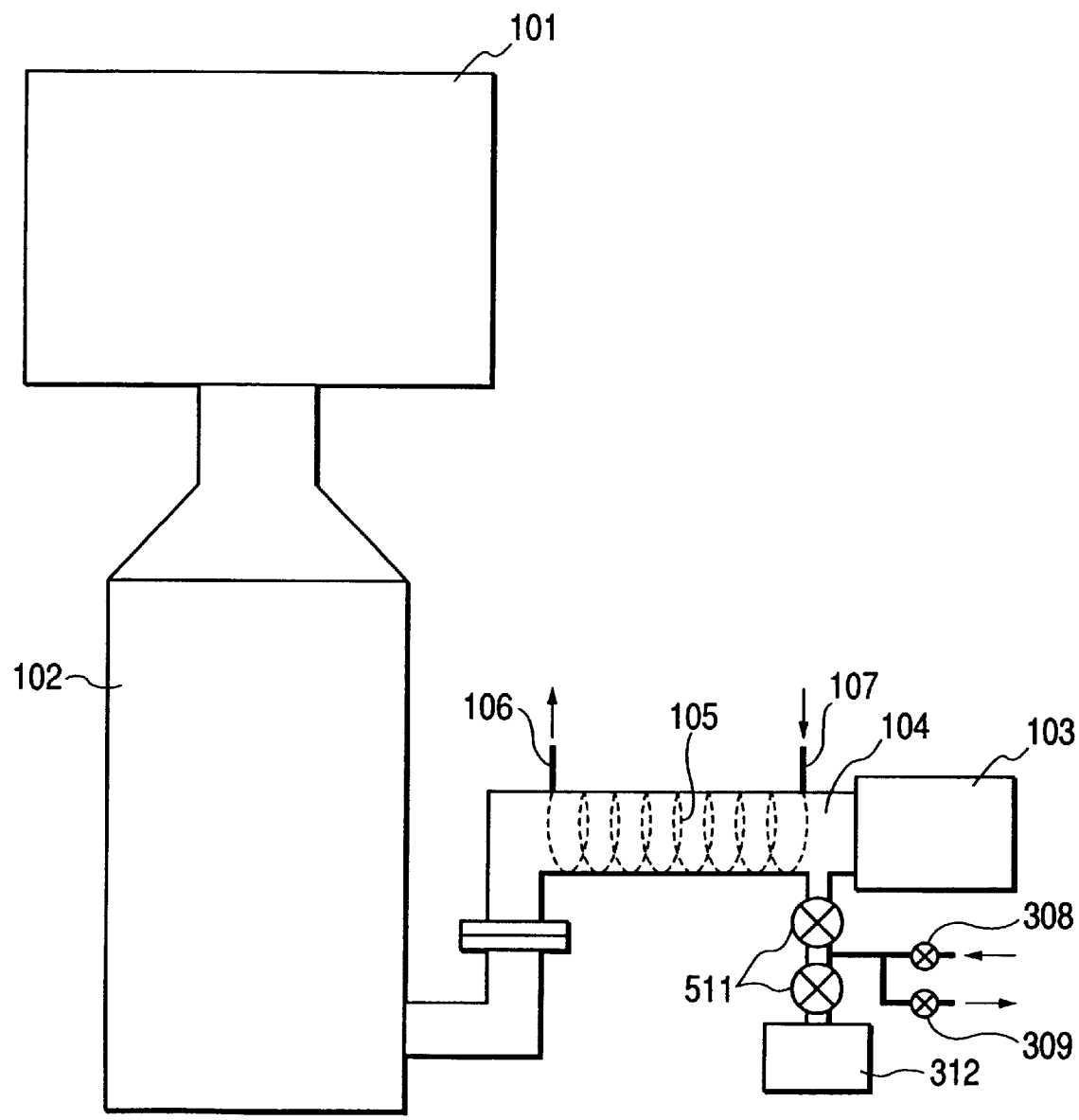
FIG. 7 is a diagrammatic side view of a further deposited-film-forming apparatus as the vacuum processing apparatus of the present invention.

A deposited-film-forming apparatus as a vacuum processing apparatus according to a fifth embodiment of the present invention has, as shown in FIG. 7, an exhaust line 104 provided horizontally at its cooling pipe portion to connect the diffusion pump 102 and the auxiliary pump 103. An oil reservoir 312 is connected with the exhaust line 104 through two on-off valves 511 and is detachable at the part between the two on-off valves 511. Other features are the same as those in the third embodiment.

Usually, when the diffusion pump 102 and the auxiliary pump 103 are operated, the on-off valves 511 are open, and the leak valve 308 and evacuation valve 309 are set closed so that the diffusion pump oil in the exhaust line 104 can be received in the oil reservoir 312. When the diffusion pump oil is removed, the upper valve of the on-off valves 511 is closed, and the lower valve thereof is kept open, whereby the internal pressure of the oil reservoir 312 is restored to atmospheric pressure by operating the leak valve 308. Thereafter, the oil reservoir 312 is detached at the part between the on-off valves 511, thereby enabling removal of the diffusion pump oil. When attached, the on-off valves 511 are connected with each other, and the lower valve is kept open, where the evacuation valve 309 is opened to evacuate the inside of the oil reservoir 312. After it has been evacuated well, the evacuation valve 309 is closed and the on-off valves 511 are opened so that the diffusion pump oil can be received. Employment of this embodiment makes it unnecessary to move the diffusion pump oil to a different container. Thus the oil collected can directly be returned into the diffusion pump 102, providing a certain convenience.

In the present embodiment, a branch pipe which connects the exhaust line 104 and one on-off valve 511 on the side closer to the exhaust line 104 as shown in the drawing may be provided. This enables easy collection of the diffusion pump oil formed by liquefying the oil smoke in the exhaust line 104 or enables temporary reservation of the diffusion pump oil in the branch pipe when the oil reservoir 312 is replaced.

Sixth Embodiment

Figure 8:
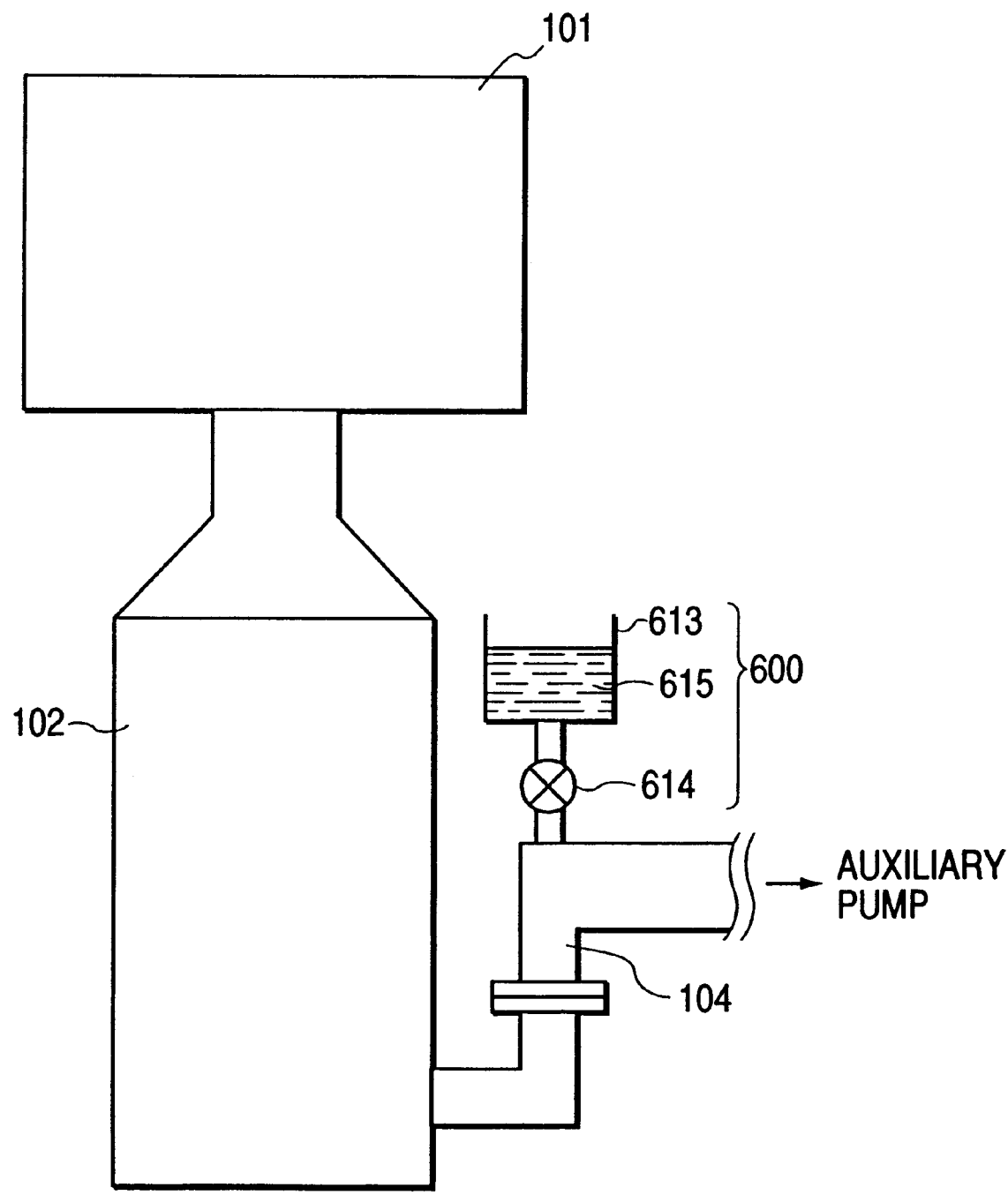
FIG. 8 is a diagrammatic view showing a diffusion pump and an oil injector which are provided in the vacuum processing apparatus of the present invention.

In the sixth embodiment of the present invention, the deposited-film-forming apparatus as the vacuum processing apparatus according to any of the first to fifth embodiments is provided with an oil injector on the exhaust line 104. FIG. 8 is a diagrammatic view of the construction of the vacuum processing apparatus of the present embodiment, showing the part having the diffusion pump 102 and an oil injector 600 provided on the exhaust line 104. The oil injector 600 is comprises an injecting-oil receiver 613 in which a diffusion pump oil 615 to be put into the diffusion pump 102 is held and an injecting on-off valve 614 for injecting the oil. To put the diffusion pump oil 615 into the diffusion pump 102, first the diffusion pump oil 615 is put into the injecting-oil receiver 613 and thereafter the injecting on-off valve 614 is opened to pour the diffusion pump oil 615 into the diffusion pump 102. When the diffusion pump oil is put into the diffusion pump 102 in the manner of the present embodiment, it is unnecessary to restore the diffusion pump internal pressure to atmospheric pressure, and hence it can be done in a very short time. In this instance, if the injecting on-off valve 614 is opened when the diffusion pump oil 615 is not present in the injecting-oil receiver 613, the air is drawn into the diffusion pump 102 and causes trouble. Hence, during operation, a shall amount of diffusion pump oil 615 must always remain in the injecting-oil receiver 613.

Incidentally, the diffusion pump oil put into the diffusion pump 102 from the oil injector 600 may be a virgin oil, the diffusion pump oil recovered in the oil reservoir described in the third, fourth and fifth embodiments, or a mixture of both, any of which may preferably appropriately be used.

In the present embodiment, the oil injector 600 may preferably be provided on the side closer to the diffusion pump 102 because the injected diffusion pump oil 615 can readily be received in the diffusion pump 102.

Seventh Embodiment

Figure 9:
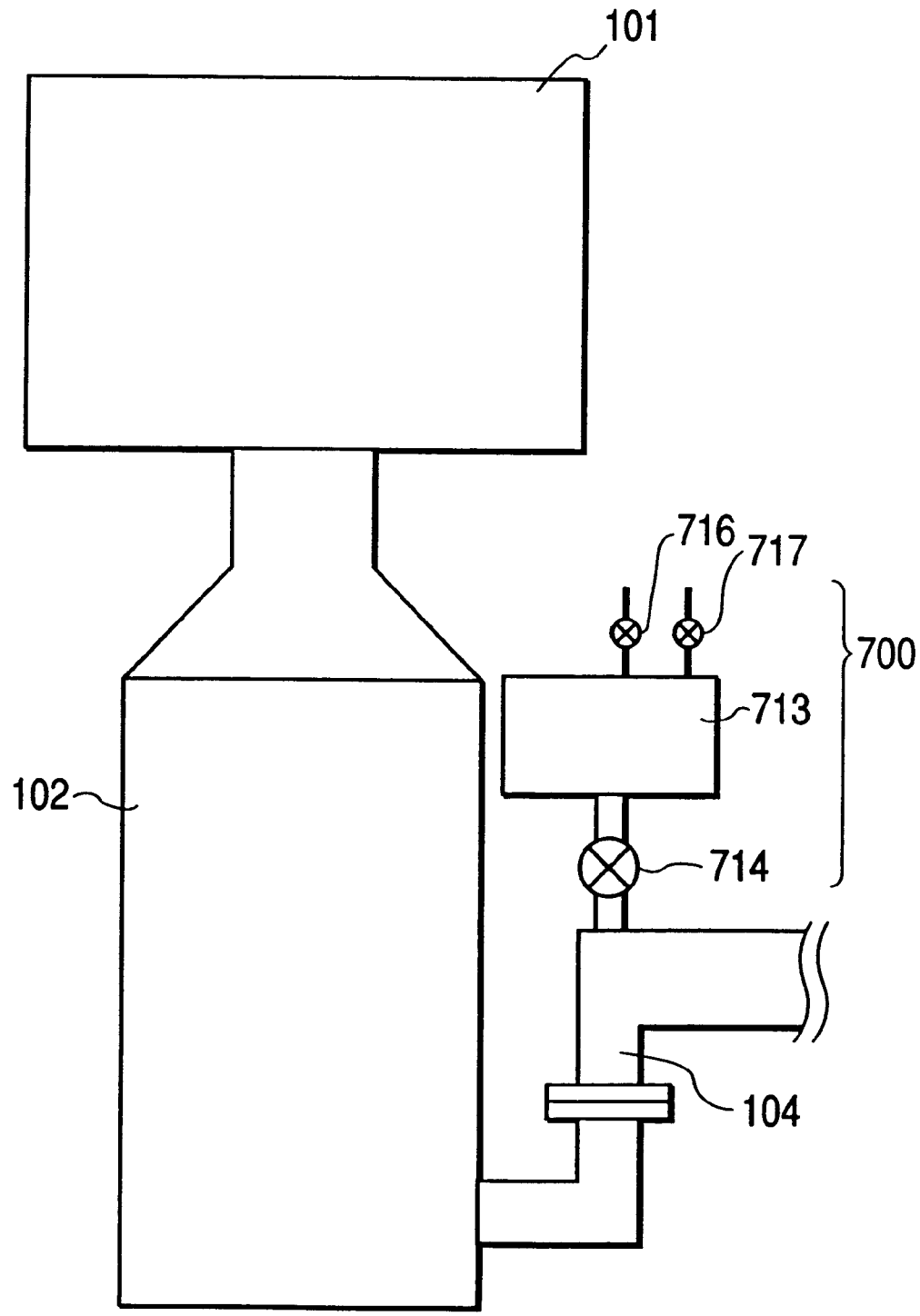
FIG. 9 is a diagrammatic view also showing a diffusion pump and an oil injector which are provided in the vacuum processing apparatus of the present invention.

In the seventh embodiment of the present invention, the deposited-film-forming apparatus as the vacuum processing apparatus according to any of the first to fifth embodiments is provided with a closed oil injector. FIG. 9 is a diagrammatic view of the construction of the vacuum processing apparatus of the present embodiment, showing the part having the diffusion pump 102 and a closed oil injector 700 provided on the exhaust line 104. In FIG. 9, reference numeral 713 denotes an injecting-oil receiver in which a diffusion pump oil 615 to be returned to the diffusion pump 102 is held; 714, an injecting on-off valve for injecting the oil; 716, an oil injection valve for putting the diffusion pump oil into the injecting-oil receiver 713; and 717, an evacuation valve for evacuating the inside of the injecting-oil receiver 713. To return the diffusion pump oil to the diffusion pump 102, first the injecting on-off valve 714 and evacuation valve 717 are closed, where the oil injection valve 716 is opened to restore the internal pressure of the injecting-oil receiver 713 to atmospheric pressure and also to fill the injecting-oil receiver 713 with the diffusion pump oil. Thereafter, the oil injection valve 716 is closed and the evacuation valve 717 is opened to evacuate the inside of the injecting-oil receiver 713. Thereafter, the injecting on-off valve 714 is opened as desired, to inject the diffusion pump oil into the diffusion pump 102. In the case of the present system, there is no possibility of drawing air into the diffusion pump 102 even if the injecting on-off valve 714 is opened when diffusion pump oil is not present in the injecting-oil receiver 713. Hence, the diffusion pump oil can more safely be returned.

The deposited-film-forming apparatus as the vacuum processing apparatus according to the present embodiment may also be provided with an oil gauge so that the quantity of the diffusion pump oil in the diffusion pump 102 can be controlled. This is preferable in view of the advantage that the diffusion pump oil can be supplied safely and with ease.

Incidentally, the injecting-oil receiver 613 or 713 may beforehand be provided with a sight window with graduations for checking oil quantity; thus, the amount of diffusion pump oil that has been injected can be checked, providing a certain convenience.

In the vacuum processing apparatus of the present invention, the cooling pipe 105 may be made of a material durable to refrigerant passing through the interior of the pipe and having a good heat conduction. Stated specifically, materials preferable for use include copper, aluminum, gold, silver, platinum, lead, nickel, cobalt, iron, chromium, molybdenum, titanium, stainless steel, and composite materials of two or more of these materials, as well as insulating materials such as polyester, polyethylene, polycarbonate, cellulose acetate, polypropylene, polyvinyl chloride, polyvinylidene chloride, polystyrene, glass and ceramics.

With regard to the shape of the cooling pipe 105, a pipe having a shape that ensures a large area of contact with the exhaust gases is preferably used. Stated specifically, the pipe may be provided on or in the inner wall of the exhaust line 104 in the shape of a coil, a net or a plurality of straight lines. Also, the exhaust line 104 may be a coaxial double-wall pipe, and the space between its outer pipe and inner pipe may be used as the cooling pipe 105, through which space the refrigerant flows. Such an embodiment is also preferable in view of space saving and readiness for maintenance.

Alternatively, a detachable cooling pipe 105 may be wound around the outside of the exhaust line in the form of a coil or a net, or a plurality of straight pipes may be arranged around it. The temperature in the exhaust line 104 can be controlled also when the cooling pipe 105 is provided on the outside of the exhaust line 104. A cooling air feed means (not shown) may also be provided so that the exhaust line 104 can be cooled by blowing cooling air against its exterior. In the case where the cooling pipe 105 is provided on the inside of the exhaust line 104, the cooling pipe 105 may be provided with fins in order to enlarge the area of contact with the exhaust gases so that the present invention can be more effective. Also, in the case where the cooling pipe 105 is provided on the outside of the exhaust line 104, the exhaust line 104 may be made to have an uneven inner wall or may be provided with fins so that the present invention can be more effective.

The length of the exhaust line 104 may be determined as desired, depending on the scale of exhaust space of the film-forming furnace to be evacuated by the diffusion pump, as exemplified by the installation space, shape and internal diameter of the deposited-film-forming apparatus. To better obtain the effect of the present invention, a piping length may preferably be made slightly large. However, since an extremely large piping length may result in a low exhaust capacity, the length may preferably be determined while taking even balance of the effect, the cost, the space used exclusively therefor and so forth.

As the refrigerant flowing in the cooling pipe 105, either gas or liquid may be used. In view of cooling effect and temperature controllability, liquids are preferred. In particular, water may preferably be used. As the water, usual city water may be used. As the water used as the refrigerant, constant-temperature water may be used. Besides the water, oil or liquid nitrogen may also preferably be used as the liquid.

In the embodiments described above, the diffusion pump oil recovery means 110 need not necessarily be provided in the diffusion pump 102.

An electrophotographic photosensitive member produced using the exhaust system of the present invention and an example of the deposited-film-forming apparatus as a vacuum processing apparatus used to produce the electrophotographic photosensitive member are specifically described below with reference to the drawings.

Figure 10:
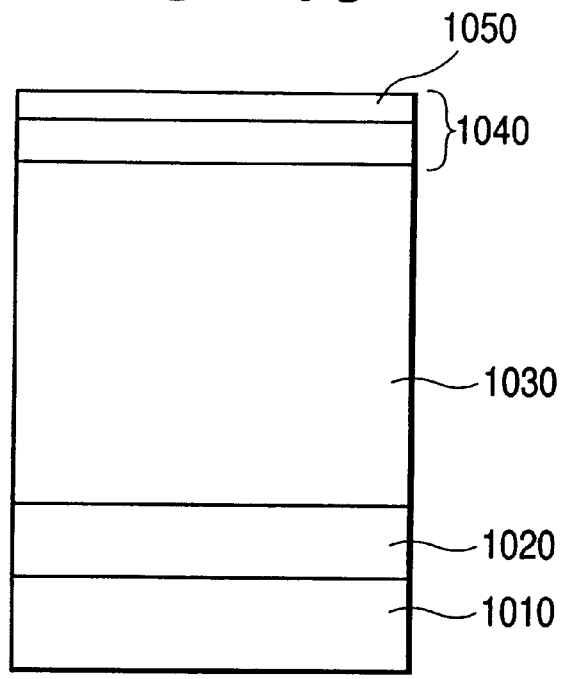
FIG. 10 is a partial diagrammatic cross-sectional view of an electrophotographic photosensitive member obtained in the present invention.

FIG. 10 is a partial diagrammatic cross-sectional view illustrating an example of the layer configuration of an electrophotographic photosensitive member which can be produced by the system of the present invention. What is shown in FIG. 10 is a a single-layer type photosenstive member, comprising a photoconductive layer not functionally separated. This is a photosensitive member comprising a substrate 1010 and superposed thereon a charge injection blocking layer 1020, a photoconductive layer 1030 formed of a-Si containing at least hydrogen and a surface layer 1040 formed of non-single-crystal carbon. Reference numeral 1050 denotes a fluorine-diffused region present on the outermost surface of the surface layer.

Figure 11:
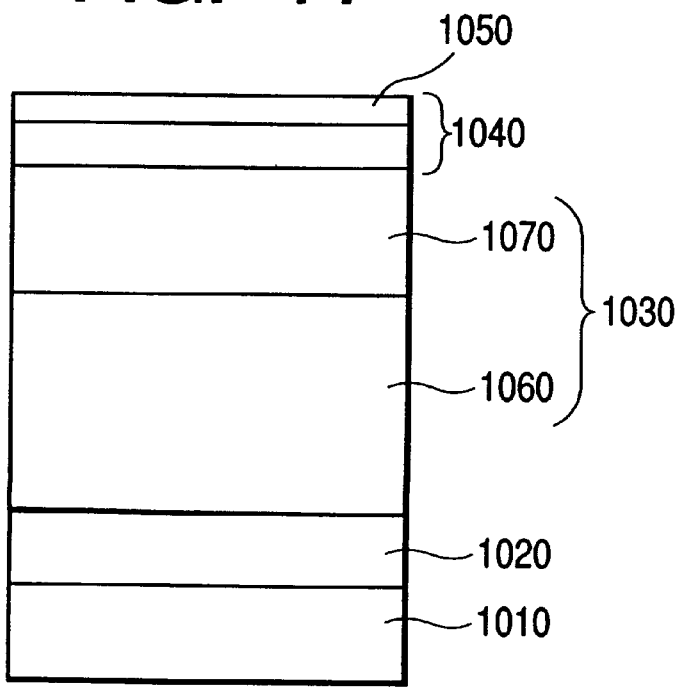
FIG. 11 is a partial diagrammatic cross-sectional view of another electrophotographic photosensitive member obtained in the present invention.

FIG. 11 illustrates a function separted type electrophotographic photosensitive member called a function-separated type, comprising a photoconductive layer functionally separated into a charge generation layer and a charge transport layer. This comprises a substrate 1010 and a charge injection blocking layer 1020 optionally formed on the substrate and deposited thereon a photoconductive layer 1030 functionally separated into a charge transport layer 1060 and a charge generation layer 1070, formed of a-Si containing at least hydrogen, and a surface layer 1040 further superposed thereon, formed of non-single-crystal carbon. Here, the charge transport layer 1060 and the charge generation layer 1070 may be used in any positional relationship. When the separation of functions is made by compositional change, the compositional change may be continuous.

In the photosensitive members shown in FIGS. 10 and 11, the respective layers may involve continuous compositional changes and may have no clear interfaces between them. The charge injection blocking layer 1020 may be omitted as desired. Between the photoconductive layer 1030 and the surface layer 1040 formed of non-single-crystal carbon, an intermediate layer may optionally be provided for the purpose of improving adhesion. Materials for the intermediate layer may include SiC, having a composition intermediate between the photoconductive layer 1030 and the surface layer 1040. Alternatively, SiO or SiN may be used. The intermediate layer may have a continuosly changing composition.

The non-single-crystal carbon herein referred to may chiefly indicate amorphous carbon having properties intermediate between graphite and diamond. It may be microcrystalline or polycrystalline in part. Films containing it can be formed by plasma CVD, sputtering or ion plating. Films formed by plasma CVD have both high transparency and hardness, and are preferable for their use as surface layers of electrophotographic photosensitive members.

As electric-discharge frequencies used in the plasma CVD used when such non-single-crystal carbon films are formed, any frequencies may be used. On an industrial scale, high frequencies of from 1 to 450 MHz, called RF frequency bands, in particular, 13.56 MHz, may preferably be used. Especially when high frequencies of frequency bands called VHF, of from 50 to 450 MHz, are used, the films can be formed in both higher transparency and hardness, and are more preferable when used as surface layers.

Figure 12:
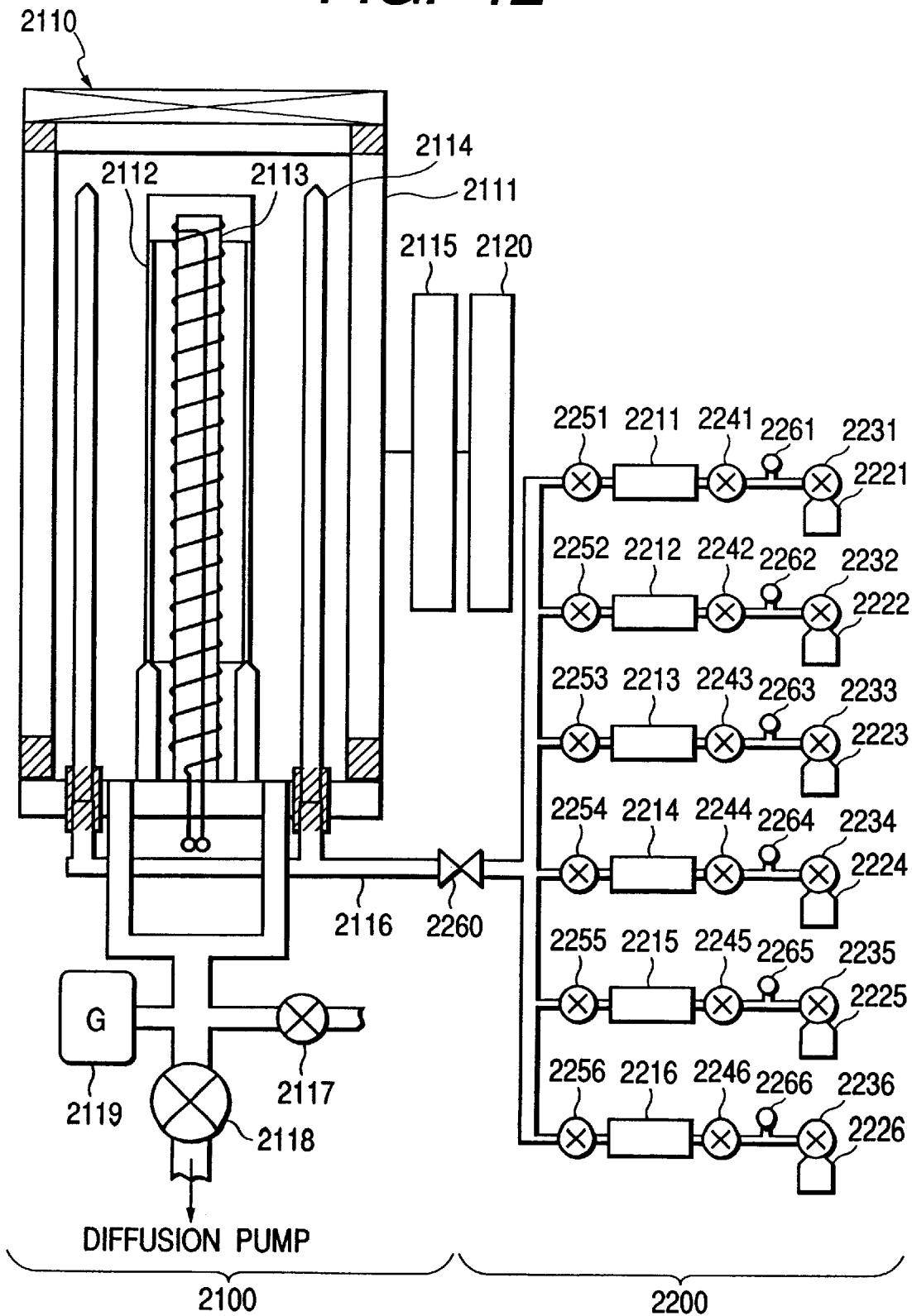
FIG. 12 is a diagrammatic view of an electrophotographic photosensitive member forming apparatus as an example of the vacuum processing apparatus of the present invention.

FIG. 12 shows an example of the film-forming furnace 101 described in embodiments. Here is a diagrammatic illustration of a vacuum processing section having the part of the film-forming furnace 101 of the vacuum processing apparatus as a deposited-film-forming apparatus for producing a photosensitive member by plasma CVD using a high-frequency power source.

Stated roughly, the vacuum processing section has a deposition system 2100 and a material gas feed system 2220. The deposition system 2100 is connected to the exhaust system (not shown) of the present invention. In a reactor (reaction furnace) 2110 in the deposition system 2100, a film-forming target cylindrical substrate 2112 connected to a ground, a heater 2113 for heating the film-forming target cylindrical substrate 2112, and a material gas feed pipe 2114 are provided. A high-frequency power source 2120 is also connected to the reactor via a high-frequency matching box 2115.

The material gas feed system 2220 is comprises gas cylinders 2221 to 2226 for material gases and etching gases, such as $SiH_4$, $H_2$, $CH_4$, NO, $B_2H_6$ and $CF_4$, valves 2231 to 2236, 2241 to 2246 and 2251 to 2256, and mass flow controllers 2211 to 2216. The gas cylinders for the respective component gases are connected to the gas feed pipe 2114 in the reactor 2110 through a valve 2260.

The high-frequency power source used for producing plasma may have any output power so long as it can output an electric power, within the range of from 10 W to 5,000 W, suitable for systems used. With regard to the degree of output variability of the high-frequency power source, it may be of any value.

As the matching box 2115 used, those having any constitution may preferably be used so long as they can make matching between the high-frequency power source 2120 and load. As methods for the matching, it may preferably be automatically controlled or may be manually controlled without any adverse effect on the present invention at all.

As materials for a cathode electrode 2111 to which the high-frequency power is to be applied, usable are copper, aluminum, gold, silver, platinum, lead, nickel, cobalt, iron, chromium, molybdenum, titanium, stainless steel, and composite materials of two or more of these materials are suitable for use. The cathode electrode may preferably have a cylindrical shape and may have an oval shape or a polygonal shape as desired.

The cathode electrode 2111 may be optionally provided with a cooling means. As a specific cooling means, the electrode may be cooled with water, air, liquid nitrogen or Peltier devices, which may be selected as desired.

The film-forming target cylindrical substrate 2112, which is a substrate to be processed, may be made of any material and may have any shape in accordance with its uses. For example, with regard to its shape, it may preferably be cylindrical when electrophotographic photosensitive members are produced or may have the shape of a flat plate or any other shape as desired. With regard to its material, copper, aluminum, gold, silver, platinum, lead, nickel, cobalt, iron, chromium, molybdenum, titanium, stainless steel, and composite materials of two or more of these materials, as well as insulating materials such as polyester, polyethylene, polycarbonate, cellulose acetate, polypropylene, polyvinyl chloride, polyvinylidene chloride, polystyrene, glass, quartz, ceramics and paper which are coated with conductive materials are suitable for use.

As for its surface shape, unevenness made at relatively large cycles by cutting with a cutting tool or by dimple embossing may be used in combination for the purpose of preventing interference of light so as prevent deterioration of durability against unfocused images in an environment of high temperature and high humidity. Such an effect can be obtained when the electrophotographic photosensitive member has an outermost surface roughness Rz of less than 1,000 angstroms, assuming its standard length as 5 $\mu$m. Since the surface roughness can be smoothed by fluorine plasma etching after the deposited films have been formed to produce a photosensitive member, the roughness of the substrate surface before film formation is not problematic.

An example of the procedure for forming the photosensitive member using the apparatus shown in FIG. 12 will be described below.

The film-forming target cylindrical substrate 2112 is set in the reactor 2110, and the inside of the reactor 2110 is evacuated by means of the diffusion pump. Subsequently, the temperature of the film-forming target cylindrical substrate 2112 is controlled at a prescribed temperature of from 20 to 500° C. by means of the heater 2113 for heating the film-forming target cylindrical substrate.

Before material gases for forming the photosensitive member are flowed into the reactor 2110, gas cylinder valves 2231 to 2236 and a leak valve 2117 of the reactor are checked to make sure that they are closed, and also flow-in valves 2241 to 2246, flow-out valves 2251 to 2256 and an auxiliary valve 2260 are checked to make sure that they are open. Then, a main valve 2118 is opened to evacuate the insides of the reactor 2110 and a gas feed pipe 2116 by means of the exhaust system of the present invention.

Next, at the time a vacuum gauge 2119 has been read to indicate a pressure of about $5 \times 10^{-6}$ Torr, the auxiliary valve 2260 and the flow-out valves 2251 to 2256 are closed. Thereafter, gas cylinder valves 2231 to 2236 are opened so that gases are respectively introduced from gas cylinders 2221 to 2226, and each gas is controlled to have a pressure of 2 kg/cm$^2$ by operating pressure controllers 2261 to 2266. Next, the flow-in valves 2241 to 2246 are slowly opened so that gases are respectively introduced into mass flow controllers 2211 to 2216.

After the film formation is thus ready to start through the above procedure, the photoconductive layer is formed on the film-forming target cylindrical substrate 2112. Incidentally, the auxiliary pump is operated together with the diffusion pump, where by the cooling means (cooling pipe) provided along the exhaust line effectively liquefies the vaporized diffusion pump oil drawn from the diffusion pump which exhausts gases from the reactor 2110, and hence prevents it from reaching the auxiliary pump.

When the film-forming target cylindrical substrate 2112 has a prescribed temperature, some necessary flow-out valves among the flow-out valves 2251 to 2256 and the auxiliary valve 2260 are slowly opened so that prescribed material gases are fed into the reactor 2110 from the gas cylinders 2221 to 2226 through a gas feed pipe 2114. Next, the mass flow controllers 2211 to 2216 are operated so that each material gas is adjusted to flow at a prescribed rate. In that course, the divergence of the main valve 2118 is so adjusted that the pressure inside the reactor 2110 comes to be a prescribed pressure of not higher than 1 Torr while watching the vacuum gauge 2119.

When the internal pressure becomes stable, a high-frequency power source 2120 is set at a desired electric power, and a high-frequency power is supplied to the cathode electrode 2111 through the high-frequency matching box 2115 to cause high-frequency glow discharge to take place. The material gases fed into the reactor 2110 are decomposed by the discharge energy thus produced, so that a prescribed deposited film mainly composed of silicon is formed on the film-forming target cylindrical substrate 2112. After a film with a desired film thickness has been formed, the supply of high-frequency power is stopped, and the flow-out valves 2251 to 2256 are closed to stop material gases from flowing into the reactor 2110. Thus, the formation of the photoconductive layer is completed.

When the surface layer is formed on the photoconductive layer, basically the above operation may be repeated, and film forming gases and etching gases may be fed.

Stated specifically, some necessary flow-out valves among the valves 2251 to 2256 and the auxiliary valve 2260 are slowly opened so that material gases necessary for the surface layer are fed into the reactor 2110 from the gas cylinders 2221 to 2226 through a gas feed pipe 2114. Next, the mass flow controllers 2211 to 2216 are operated so that each material gas is adjusted to flow at a prescribed rate. In that course, the divergence of the main valve 2118 is so adjusted that the pressure inside the reactor 2110 comes to be a prescribed pressure of not higher than 1 Torr while watching the vacuum gauge 2119.

When the internal pressure becomes stable, a high-frequency power source 2120 is set at a desired electric power, and a high-frequency power is supplied to the cathode electrode 2111 through the high-frequency matching box 2115 to cause high-frequency glow discharge to take place. The material gases fed into the reactor 2110 are decomposed by the discharge energy thus produced, so that the surface layer is formed. After a film with a desired thickness has been formed, the supply of high-frequency power is stopped, and the flow-out valves 2251 to 2256 are closed to stop material gases from flowing into the reactor 2110. Thus, the formation of the surface layer is completed.

After the gases used for film formation have been thoroughly exhausted from the inside of the reactor, some necessary flow-out valves among the valves 2251 to 2256 and the auxiliary valve 2260 are slowly opened so that a gas containing at least fluorine atoms, necessary for the etching is fed into the reactor 2110 from the gas cylinders 2221 to 2226 through a gas feed pipe 2114. Next, the mass flow controllers 2211 to 2216 are operated so that the fluorine-containing gas is adjusted to flow at a prescribed rate. In that course, the divergence of the main valve 2118 is so adjusted that the pressure inside the reactor 2110 comes to be a prescribed pressure of not higher than 1 Torr while watching the vacuum gauge 2119.

When the internal pressure becomes stable, a high-frequency power source 2120 is set at a desired electric power, and a high-frequency power is supplied to the cathode electrode 2111 through the high-frequency matching box 2115 to cause high-frequency glow discharge to take place. The fluorine-containing gas fed into the reactor 2110 is decomposed by the discharge energy thus produced and reacts with the surface layer, so that the surface layer is etched.

The control of surface shape and the depth in which the fluorine atoms are contained can be set arbitrarily by changing inner pressure, high-frequency power, substrate temperature and so forth; thus any desired conditions can be set.

After the surface layer has been etched in a desired depth, the supply of high-frequency power is stopped, and the flow-out valves 2251 to 2256 are closed to stop the fluorine-containing gas from flowing into the reactor 2110. The etching of the deposited film is thus completed.

During film formation, the film-forming target cylindrical substrate 2112 may be rotated at a prescribed speed by means of a drive (not shown).

Figure 13:
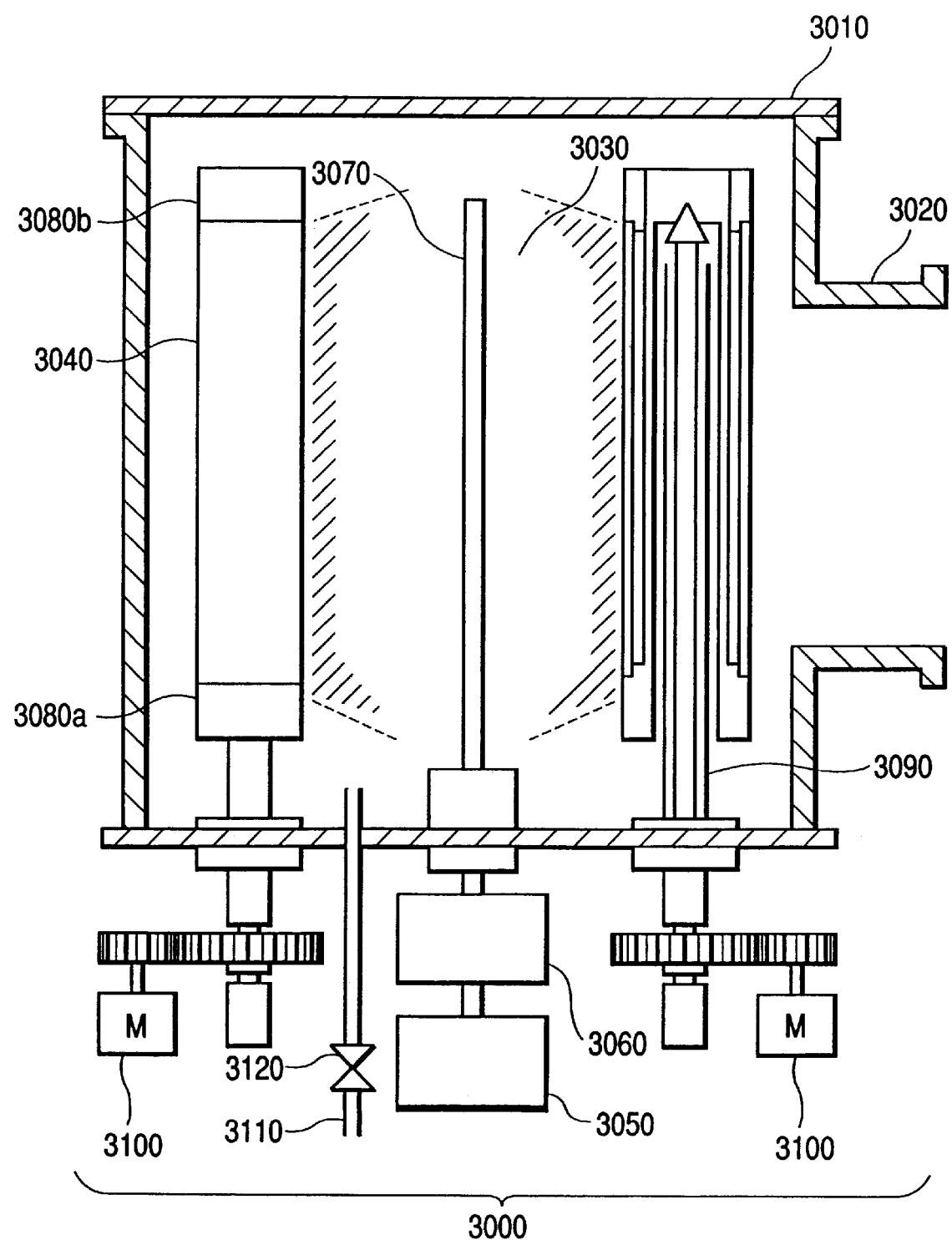
FIG. 13 is a diagrammatic view of another electrophotographic photosensitive member forming apparatus as an example of the vacuum processing apparatus of the present invention.

FIG. 13 is a diagrammatic view of an example of an apparatus (mass production type) for forming electrophotographic photosensitive members by plasma CVD as an embodiment different from that shown in FIG. 12. FIG. 13 shows a diagrammatic cross section at the part of a reactor. In FIG. 13, reference numeral 3000 denotes the reactor, which corresponds to the film-forming furnace referred to in FIG. 1 and has a vacuum closed structure. Reference numeral 3020 denotes an exhaust pipe, one end of which opens to the inside of the reactor 3010 and the other end of which communicates with the exhaust system (not shown). Reference numeral 3030 denotes a discharge space surrounded by a plurality of film-forming target cylindrical substrates 3040. A high-frequency power source 3050 is electrically connected to an electrode 3070 via a high-frequency matching box 3060. The film-forming target cylindrical substrates 3040 are each placed around a rotating shaft 3090 and set on holders 3080a and 3080b. They are so set as to be rotatable as desired.

As a material gas feed system (not shown), the same one as shown in FIG. 12 by reference numeral 2200 may be used. Constituent gases are mixed and fed into the reactor 3010 through a gas feed pipe 3110 via a valve 3120.

As the high-frequency power source of the present apparatus, a power source having any output power may be used so long as it can produce a power suited for the apparatus used, e.g., at an output power within the range of from 10 W to 5,000 W. Also, with regard to the degree of output variability of the high-frequency power source, it may be of any value.

As the matching box 3060 used, those having any constitution may preferably be used so long as they can make matching between the high-frequency power source 3050 and load. As methods for the matching, it may preferably be automatically controlled or may be manually controlled without any adverse effect on the present invention at all.

As materials for the electrode 3070 to which the high-frequency power is to be applied, suitable materials include copper, aluminum, gold, silver, platinum, lead, nickel, cobalt, iron, chromium, molybdenum, titanium, stainless steel, and composite materials of two or more of these materials. The electrode may preferably have a cylindrical shape and may have an oval shape or a polygonal shape as desired. The electrode 3070 may be optionally provided with a cooling means. As a specific cooling means, the electrode may be cooled with water, air, liquid nitrogen or Peltier devices, which may be selected as desired.

The film-forming target cylindrical substrates 3040 may be made of any material and may have any shape in accordance with its uses. For example, with regard to the shape, they may preferably be cylindrical when electrophotographic photosensitive members are produced or may have the shape of a flat plate or any other shape as desired. With regard to its material, copper, aluminum, gold, silver, platinum, lead, nickel, cobalt, iron, chromium, molybdenum, titanium, stainless steel, and composite materials of two or more of these materials, as well as insulating materials such as polyester, polyethylene, polycarbonate, cellulose acetate, polypropylene, polyvinyl chloride, polyvinylidene chloride, polystyrene, glass, quartz, ceramics and paper which are coated with conductive materials are suitable for use.

EXAMPLES

The present invention will be described in the following examples. The present invention is by no means limited by these.

Example 1

Continuous film formation was tested using a deposited-film-forming apparatus having the exhaust system shown in FIG. 1. As a material gas, silane ($SiH_4$) gas was flowed at 800 sccm, and the film-forming furnace was set at an internal pressure of 2 Pa by evacuating its inside by means of the diffusion pump and the auxiliary pump. In this state, a high-frequency power was applied by a high-frequency power source (not shown) to form films. The films were formed repeatedly until the total time for film formation reached 100 hours. After film formation was completed, the oil gauge of the diffusion pump was observed to acknowledge that the oil level had dropped. The exhaust line was also detached to examine its interior to find that the diffusion pump oil stood there. This diffusion pump oil was collected and returned to the diffusion pump, so that the oil level was restored to the original level.

The quantity of oil in the rotary pump used as the auxiliary pump was also checked to confirm that there was no change in the oil level and that no diffusion pump oil had flowed into the rotary pump.

Comparative Example 1

Figure 14:
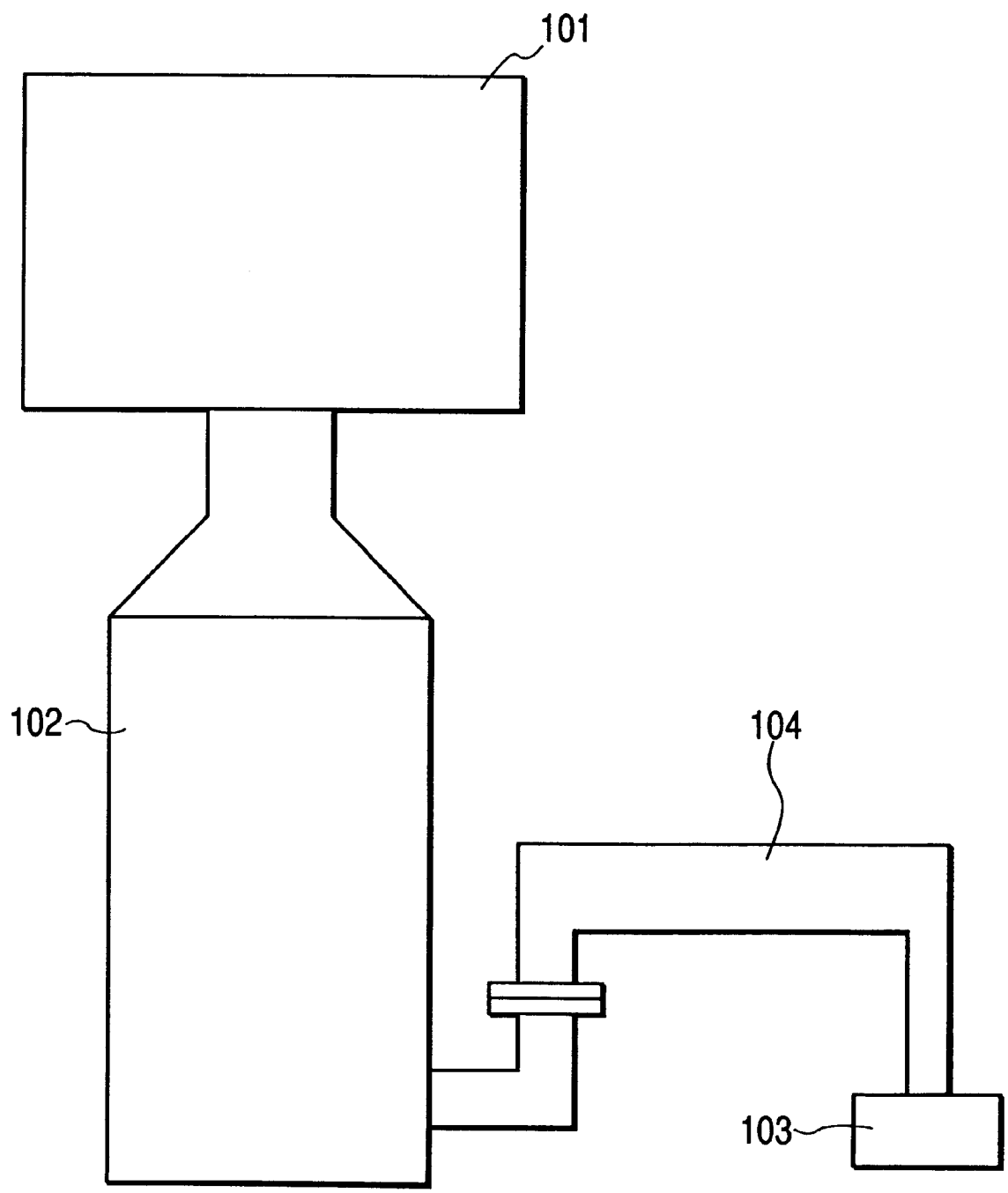
FIG. 14 is a diagrammatic side view of a deposited-film-forming apparatus used for a comparative example.

Continuous film formation was tested in the same manner as in Example 1 but using a conventional deposited-film-forming apparatus shown in FIG. 14. As material gases, silane ($SiH_4$) gas and helium (He) gas were flowed at 400 sccm and 2,500 sccm, respectively, and the film-forming furnace was set at an internal pressure of 2 Pa by evacuating its inside by means of the diffusion pump and the auxiliary pump. In this state, a high-frequency power was applied by a high-frequency power source (not shown) to form films. The films were formed repeatedly until the total time for film formation reached 100 hours. After film formation was completed, the oil gauge of the diffusion pump was observed to acknowledge a decrease in the oil level. The exhaust line was also detached to examine its interior to find that the diffusion pump oil did not stand there and was not able to be returned to the diffusion pump.

The quantity of oil in the rotary pump used as the auxiliary pump was also checked to confirm that there was a rise in the oil level and also a change in drive sound of the pump. The rate of exhaust was checked to confirm that it had dropped. The color of the oil was also checked to find that there was a slight change in color, i.e.; it had become pale, and the diffusion pump oil had flowed into the rotary pump. Accordingly, there was no doubt that the rotary pump would deteriorate early.

Example 2

Continuous film formation was tested using a deposited-film-forming apparatus having the exhaust system shown in FIG. 4. As material gases, silane ($SiH_4$) gas and hydrogen ($H_2$) gas were flowed at 500 sccm and 1,500 sccm, respectively, and the film-forming furnace was set at an internal pressure of 2 Pa by evacuating its inside by means of the diffusion pump and the auxiliary pump. In this state, a high-frequency power was applied by a high-frequency power source (not shown) to form films. The films were formed repeatedly, and the oil gauge of the diffusion pump was observed every time the total time for film formation exceeded 100 hours, but there was no drop in the oil level at all.

The quantity of oil in the rotary pump used as the auxiliary pump was also checked to confirm that there was no change in the oil level and that no diffusion pump oil had flowed into the rotary pump. The films were formed for 1,000 hours in total, but no changes were seen at all in the oil levels of the diffusion pump and rotary pump.

Example 3

Continuous film formation was tested using a deposited-film-forming apparatus having the exhaust system shown in FIG. 5 and to which the oil injector shown in FIG. 9 was attached. As material gases, silane ($SiH_4$) gas, hydrogen ($H_2$) gas and helium (He) gas were flowed at 250 sccm, 1,500 sccm and 2,000 sccm, respectively, and the film-forming furnace was set at an internal pressure of 2.5 Pa by evacuating its inside by means of the diffusion pump and the auxiliary pump. In this state, a high-frequency power was applied by a high-frequency power source (not shown) to form films. The films were formed repeatedly, and the oil gauge of the diffusion pump was observed every time the total time for film formation exceeded 100 hours, to confirm that the oil level had dropped and the oil had been collected in the oil reservoir. The diffusion pump oil thus collected was returned to the diffusion pump through the oil injector shown in FIG. 9, so that the oil level was restored to the original level to confirm that all the oil had been recovered. Here, the diffusion pump was operated and its inside maintained a vacuum, but the diffusion pump oil was able to be returned thereto without any problems or danger.

Moreover, in the deposited-film-forming apparatus of the present example, the state of the diffusion pump oil collected in the oil reservoir was observable. This brought about advantages that oil management was easy and the diffusion pump oil was supplied or exchanged with ease, so that the durability or maintenance performance of the apparatus was improved.

According to the exhaust system of the present invention, since the first exhaust means and the second exhaust means are connected through an exhaust line and the exhaust line is provided with the cooling means, the exhaust line may be cooled by the cooling means so that the oil smoke contained in the exhaust gases drawn out of the first exhaust means can be liquefied or condensed to cause the resultant oil to deposit in the exhaust line. As a result, the oil smoke can be prevented from flowing into the second exhaust means. Thus, even when material gases fed in at a high rate are exhausted, the exhaust system can be free from the problem that the oil in the first exhaust means flows to the side of the second exhaust means causing an abrupt decrease in the amount of oil or that the oil of the first exhaust means stands in the second exhaust means. Therefore its performance can be maintained over a long period of time, making it possible to reduce the maintenance cost of the system.

According to the vacuum processing apparatus of the present invention, having the diffusion pump and the auxiliary pump as exhaust means, the diffusion pump and the auxiliary pump are connected through an exhaust line and the exhaust line is provided with the cooling unit. In this way, the exhaust line is cooled by the cooling means so that the diffusion pump oil (e.g., in the state of oil smoke) contained in the exhaust gases can be liquefied or condensed to cause the resultant oil to deposit in the exhaust line. As a result, the diffusion pump oil can be prevented from flowing into the auxiliary pump. Thus, even when material gases fed in at a high rate are exhausted, the exhaust system can be free from the problem that the oil in the diffusion pump flows causing an abrupt the side of the auxiliary pump to decrease in the amount of oil or that the oil of the diffusion pump stands in the auxiliary pump. Therefore its performance can be maintained over a long period of time, making it possible to reduce the maintenance cost of the system.

In addition, according to the present invention, any contamination occurring in the production process can be restrained to a minimum with ease, the production time can be made short, promising a low cost, and vacuum processing such as deposited-film formation can be carried out in good reproducibility.

Thus, the present invention makes it possible to obtain deposited films or processed films having a good film quality and a high uniformity and to materialize a vacuum processing apparatus and vacuum processing method enabling easy control of film thickness and promising a low production cost.

What is claimed is:

1. An exhaust system comprising:
a first exhaust means, wherein the first exhaust means is a diffusion pump;
a second exhaust means fir exhausting an exhaust gas of the first exhaust means;
an exhaust line connecting the first exhaust means and the second exhaust means; and
a first cooling means for cooling the exhaust line provided between the first and second exhaust means.

2. The exhaust system according to claim 1, wherein the first exhaust means includes a second cooling means different from the first cooling means.

3. The exhaust system according to claim 1, wherein the first exhaust means evacuates the inside of a container and has a gas feed means for feeding a gas into the container.

4. The exhaust system according to claim 3, wherein the container is a reactor.

5. The exhaust system according to claim 3, wherein the container is usable at an internal pressure ranging from 10 mPa to 15 Pa.

6. The exhaust system according to claim 3, wherein the container constitutes at least a part of a deposited film forming apparatus for forming a deposited film on a processing target substrate held in the container.

7. The exhaust system according to claim 3, wherein the container constitutes at least a part of a vacuum processing apparatus for treating a processing target substrate in the evacuated container.

8. The exhaust system according to claim 1, wherein the first cooling means is a pipe provided in the inner wall of the exhaust line.

9. The exhaust system according to claim 1, wherein the first cooling means is a pipe provided on the inner wall of the exhaust line in such a manner as to be exposed to the exhaust path.

10. The exhaust system according to claim 1, wherein the first cooling means is a pipe provided on the periphery of the exhaust line.

11. The exhaust system according to claim 1, wherein the first cooling means is provided on the exhaust line in a spiral form.

12. The exhaust system according to claim 1, wherein the first cooling means is means for flowing a refrigerant.

13. The exhaust system according to claim 1, wherein the exhaust line has a rising part in the vicinity of a part of the exhaust line connected to the second exhaust means.

14. The exhaust system according to claim 1, wherein the exhaust line is so provided as to be low on the side of the first exhaust means and high on the side of the second exhaust means.

15. The exhaust system according to claim 1, wherein the exhaust line is connected to an oil reservoir.

16. The exhaust system according to claim 15, wherein the oil reservoir has an on-off valve and an oil discharge valve between the oil reservoir and the exhaust line.

17. The exhaust system according to claim 15, wherein the oil reservoir has a leak valve.

18. The exhaust system according to claim 15, wherein the oil reservoir has an evacuation valve.

19. The exhaust system according to claim 15, wherein an on-off valve is provided between the oil reservoir and the exhaust line, and the oil reservoir is detachable from the exhaust line so that oil can be discharged while maintaining a vacuum in the first exhaust means and the second exhaust means.

20. The exhaust system according to claim 1, wherein the exhaust line has an oil receiver from which oil is flowed into the first exhaust means.

21. The exhaust system according to claim 20, wherein an on-off valve is provided between the oil receiver and the exhaust line.

22. The exhaust system according to claim 20, wherein a vacuum can be maintained in the oil receiver.

23. The exhaust system according to claim 20, wherein the oil receiver has an evacuation valve.

24. A vacuum processing apparatus comprising a reactor and a vacuum pump connected to the reactor to draw up a gas held in the reactor, the vacuum pump comprising a diffusion pump and an auxiliary pump, and the apparatus further comprising:

an exhaust line provided between the diffusion pump and the auxiliary pump; and a cooling unit provided in the exhaust line for cooling the gas to liquefy or condense an oil smoke comprised of a diffusion pump oil contained in the gas, thereby causing the resultant oil to deposit in the exhaust line.

* * * * *

UNITED STATES PATENT AND TRADEMARK OFFICE
CERTIFICATE OF CORRECTION

PATENT NO.   : 6,203,618 B1
DATED        : March 20, 2001
INVENTOR(S)  : Junichiro Hashizume et al.

It is certified that error appears in the above-identified patent and that said Letters Patent is hereby corrected as shown below:

Title page,
Item [57], ABSTRACT,
Line 9, "exhaust line. ¶ The diffusion" should read -- exhaust line. The diffusion --.

Column 2,
Line 36, "use" should read -- use and --;
Line 38, "of" (both occurrences) should be deleted; and
Line 57, "results" should read -- result --.

Column 3,
Line 7, "of" should read -- of the --;
Line 49, "reactor;" should read -- reactor, --; and
Line 51, "pump;" should read -- pump, --.

Column 4,
Line 58, "expenditures" should read -- expenditure --.

Column 5,
Line 16, "enters," should read -- enters --.

Column 6,
Line 40, "reaches" should read -- reach --;
Line 50, "may" should read -- may be --; and
Line 54, "oils, and" should read -- oils and --.

Column 7,
Line 63, "a degree." should read -- a great degree. --.

Column 8,
Line 10, "set" should be deleted;
Line 22, "been" should read -- been sufficiently --;
Line 23, "well" should be deleted; and "closed and" should read -- closed, and --;
Line 27, "Thus the" should read -- Thus, the --;
Line 47, "is" should be deleted; and
Line 63, "shall" should read -- small --.

UNITED STATES PATENT AND TRADEMARK OFFICE
CERTIFICATE OF CORRECTION

PATENT NO.     : 6,203,618 B1
DATED          : March 20, 2001
INVENTOR(S)    : Junichiro Hashizume et al.

It is certified that error appears in the above-identified patent and that said Letters Patent is hereby corrected as shown below:

Column 9,
Line 25, "where" should read -- and --.

Column 10,
Line 63, "function separated" should read -- function-separated --.

Column 11,
Line 29, "hardness, and" should read -- hardness and --;
Line 38, "hardness, and" should read -- hardness and --;
Line 41, "in" should read -- in the --; and
Line 59, "is" should be deleted.

Column 12,
Line 41, "so as" should read -- so as to --.

Column 13,
Line 18, "where by" should read -- whereby --.

Column 16,
Line 20, "i.e.;" should read -- i.e., --.

Column 17,
Line 37, "causing an abrupt" should read -- to -- ; and "to" should read -- causing an abrupt --;
Line 39, "Therefore" should read -- Therefore, --; and
Line 59, "fir" should read -- for --.

UNITED STATES PATENT AND TRADEMARK OFFICE
CERTIFICATE OF CORRECTION

PATENT NO. : 6,203,618 B1
DATED : March 20, 2001
INVENTOR(S) : Junichiro Hashizume et al.

It is certified that error appears in the above-identified patent and that said Letters Patent is hereby corrected as shown below:

Column 18,
Line 17, "in the" should read -- on the --; and
Line 30, "is means" should read -- is a means --.

Signed and Sealed this

Ninth Day of July, 2002

Attest:

JAMES E. ROGAN
*Attesting Officer*  *Director of the United States Patent and Trademark Office*